(12) United States Patent
Jenkins

(10) Patent No.: US 7,073,148 B1
(45) Date of Patent: Jul. 4, 2006

(54) ANTENNA VIOLATION CORRECTION IN HIGH-DENSITY INTEGRATED CIRCUITS

(75) Inventor: Andrew G. Jenkins, Nevada, IA (US)

(73) Assignee: Xilinx, Inc., San Jose, CA (US)

( * ) Notice: Subject to any disclaimer, the term of this patent is extended or adjusted under 35 U.S.C. 154(b) by 138 days.

(21) Appl. No.: 10/660,016

(22) Filed: Sep. 11, 2003

(51) Int. Cl.
*G06F 17/50* (2006.01)

(52) U.S. Cl. .......................................... 716/11; 716/5

(58) Field of Classification Search .................. 716/2, 716/5, 8–14, 18
See application file for complete search history.

(56) References Cited

U.S. PATENT DOCUMENTS

| | | | |
|---|---|---|---|
| 5,691,662 A * | 11/1997 | Soboleski et al. | 327/292 |
| 6,194,233 B1 * | 2/2001 | Bedner et al. | 438/14 |
| 6,502,229 B1 * | 12/2002 | Lee et al. | 716/12 |
| 6,594,809 B1 * | 7/2003 | Wang et al. | 716/10 |
| 6,601,226 B1 * | 7/2003 | Hill et al. | 716/10 |
| 6,766,496 B1 * | 7/2004 | McManus et al. | 716/1 |
| 6,792,578 B1 * | 9/2004 | Brown et al. | 716/2 |

* cited by examiner

*Primary Examiner*—Vuthe Siek
(74) *Attorney, Agent, or Firm*—Timothy W. Markison

(57) ABSTRACT

A method for correcting antenna violations in high-density integrated circuits (IC) begins by determining location of an antenna violation within a layout of a high-density integrated circuit. The processing continues by determining an affected input of a cell of the high-density integrated circuit based on the location of the antenna error. The processing then continues by identifying an available charge protection element. The processing further continues by logically coupling the available charge protection element to the affected input of the cell.

14 Claims, 5 Drawing Sheets initial IC layout intervening IC layout identify antenna violation find and connect charge protection element

ANTENNA VIOLATION CORRECTION IN HIGH-DENSITY INTEGRATED CIRCUITS

BACKGROUND OF THE INVENTION

1. Technical Field of the Invention

This invention relates generally to integrated circuits and more particularly to design, layout, and fabrication of high-density integrated circuits.

2. Description of Related Art

As is known, the traditional design flow of an integrated circuit (IC) includes: (1) establishing architectural and electrical specifications; (2) RTL (Register Transfer Level) coding; (3) RTL simulation; (4) synthesis of the RTL code to produce a netlist; (5) formal verification; (6) pre-layout chip level static timing verification; (7) place and global routing; (8) formal verification; (9) post global routing static timing verification; (10) detailed routing; (11) post-layout testing; and (12) tape out. In such a design process, the architectural specification provides functional partitioning of the IC into manageable blocks (e.g., defines the die area and which areas of the die will support memory, digital circuitry, input/output circuitry, analog circuitry, etc.). The electrical specification provides the timing relationship between the blocks and the electrical function of the blocks (e.g., the analog block includes analog to digital converters, amplifiers, drivers, etc., and at what speeds data is to be conveyed).

From the architectural and electrical specifications, RTL code is generated to describe the functionality of the blocks and/or circuits within the blocks. As is known, the RTL code may be hierarchically arranged to connect top-level blocks with lower level blocks. Once the RTL code is generated, it is simulated to verify that the design functionally meets the electrical specifications. Note that gate timing is not tested at this step of the IC design process. If the design fails the simulation, the design is modified, new RTL code is produced, and subsequently resimulated.

Once the design passes the simulation, a design compiler generates a netlist based on the RTL code, a cell library, and environmental and timing constraints. With the netlist generated, the design is formally verified to test the logical functioning of the IC design. In general, the formal verification at this phase of the IC design is to validate RTL against RTL, gate-level netlist against the RTL code, and/or a comparison between gate-level netlists.

The IC design process then proceeds to the pre-layout chip level static timing verification step, which determines net delays within the IC and compares them with the timing constraints. If the net delays are less than the timing constraints, the IC design process continues with the place and global routing step. If, however, the net delays are greater than the timing constraints, the process reverts to the synthesis step to generate a new netlist. Note that the static timing verification may focus only on the critical paths within the IC to reduce testing time.

During the place and global routing step, the gates of the circuits of the blocks are placed in the layout of the IC. Many commercially available place and route algorithms employ a time driven placement method that places cells (i.e., a gate or series of gates) in the layout based on critical timing between the cells. Once the cells are places, the clock circuitry and lines (e.g., a clock tree) are inserted into the layout. Next, global routing is performed to determine the quality of the placement and to provide estimated delays.

At this point in the IC design process, the IC is again formally tested to determine whether the net delays are less than the timing constraints. If so, the IC design process continues by performing another static timing verification. If not, the place and global routing step is repeated. If the static timing verification produces acceptable timing, the process continues by performing detailed routing. If, however, the timing is not acceptable, the IC design process reverts to the RTL synthesis step to generate a new netlist.

During the detailed routing step, the gates are coupled together via the place and route tool. Once this step is completed, the initial IC layout is finished. Before taping out and subsequently fabrication first silicon (i.e., a prototype IC), the IC layout is tested for timing violations, antenna violations (i.e., metal traces that are subject to accumulate a charge that could potentially damage the gate oxide layer of a transistor), adverse parasitic affects, etc.

If an antenna violation is detected, the place and route tools resolve the violation by first attempting to place a diode in the immediate proximity of the affected device. If a diode can be placed, it is then attached in a reverse manner to the affected device. As an alternate method for resolving an antenna violation, the place and route tool may place the affected trace on multiple metal layers and connect the trace segments with vias. In high-density integrated circuit layouts, these methods are generally not able to solve antenna violations, since there is typically very little unused die area, making it, at times, impossible to place a diode near the affected device or to place the affected trace on multiple layers. As such, with conventional place and rout tools, the IC design fails due to the uncorrectable antenna violations, which requires a substantial redesign effort to manually resolve the antenna violations.

Therefore, a need exists for a method that resolves antenna violations in high-density integrated circuit layouts without the need for a substantial IC redesign.

BRIEF SUMMARY OF THE INVENTION

The correction of antenna violations in high-density integrated circuits of the present invention substantially meets these needs and others. In one embodiment, a method for correcting antenna violations in high-density integrated circuits (IC) begins by determining location of an antenna violation within a layout of a high-density integrated circuit. The processing continues by determining an affected input of a cell of the high-density integrated circuit based on the location of the antenna error. The processing then continues by identifying an available charge protection element (e.g., a diode, a transistor, a surge protector), where the charge protection element is placed in available space in an initial IC layout. The processing further continues by logically coupling the available charge protection element to the affected input of the cell. With such a method, antenna violations can be readily corrected without substantial IC redesign efforts.

In another embodiment, a method for correcting antenna violations in high-density integrated circuits begins by interpreting an integrated circuit error report to obtain error coordinates. The processing then continues by determining a cell of the integrated circuit based on the error coordinates and a design exchange format file. The processing then continues by determining error position within the cell based on the error coordinates. The processing then continues by determining an affected input of the cell based on the error position and a library exchange file. The processing continues by identifying an available charge protection element and logically coupling the available charge protection element to the affected input of the cell. With such a method, antenna violations can be readily corrected without substantial IC redesign efforts.

DETAILED DESCRIPTION OF THE INVENTION

Figure 1:
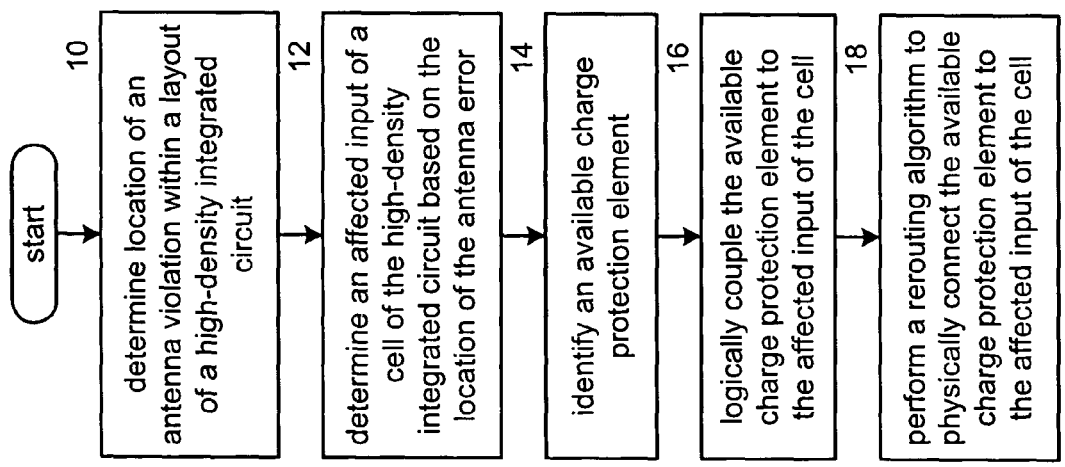
FIG. 1 is a logic diagram of a method for correcting antenna violations in high-density integrated circuits in accordance with the present invention.

FIG. 1 is a logic diagram of a method for correcting antenna violations in high-density integrated circuits that begins at step 10, where the location of an antenna violation within a layout of a high-density integrated circuit (IC) is determined. The layout of the high-density IC may be generated by first performing a place and route algorithm to position cells to form an initial layout of the high-density integrated circuit. Next, available space (i.e., die area that is not currently occupied with a cell) within the initial layout is determined. Next, at least one charge protection element (e.g., a diode, a transistor, and a surge protector) is placed within the available space. Note that, at this point in the IC design, the charge protection element is not coupled to a cell or a metal trace. The layout is completed by again performing the place and route algorithm to include the charge protection elements.

The location of the antenna violation is obtained during the traditional post-layout testing, which determines the antenna violations, timing violations, adverse parasitic affects, etc. As part of identifying antenna violations, the traditional post-layout testing further identifies the coordinates of the violation.

The processing continues at step 12, where an affected input of a cell of the high-density integrated circuit is determined based on the location of the antenna error. This may be achieved by first identifying the cell based on the location of the antenna violation. Next, circuitry within the cell corresponding to the location of the antenna violation is identified. Next, the circuitry is analyzed to determine whether the circuitry includes an element (e.g., a transistor) with an input. When the circuitry includes the element with the input, identifying the affected input as the input of the element within the circuitry.

With the affecting input determined, the process proceeds to step 14, where an available charge protection element is identified. For example, the available charge element may be identified by determining a closest charge protection element to the affected input or by determining a charge protection element along a wire coupled to the affected input.

The process then proceeds to step 16, where the available charge protection element is logically coupling to the affected input of the cell. The process then proceeds to step 18, where a routing algorithm is again performed to physically connect the available charge protection element to the affected input of the cell.

As one of average skill in the art will appreciate, the method for correcting antenna violations may be used with various IC design tools for various IC technologies, including, but not limited to, CMOS, silicon germanium, gallium arsenide, etc.

Figure 2:
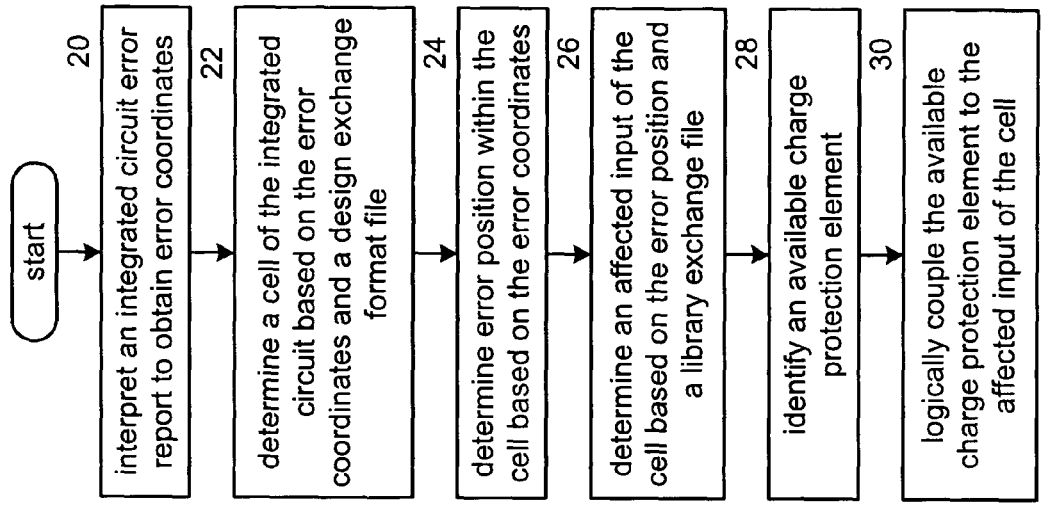
FIG. 2 is a logic diagram of another method for correcting antenna violations in high-density integrated circuits in accordance with the present invention.

FIG. 2 is a logic diagram of another method for correcting antenna violations in high-density integrated circuits that begins at step 20, where an integrated circuit error report is interpreted to obtain error coordinates. The error report is generated by a design rule checking algorithm during verification of the initial IC design. The process then proceeds to step 22, where a cell of the integrated circuit is determined based on the error coordinates and a design exchange format file. For example, the design exchange format (DEF) file includes cell level positioning information for the IC. Thus, based on the location of the error and the DEF file, the relevant cell is readily identifiable.

The process then proceeds to step 24, where an error position within the cell is determined based on the error coordinates. For example, the IC level error coordinates are converted into cell level coordinates. The process then proceeds to step 26, where an affected input of the cell is determined based on the error position and a library exchange file. In one embodiment, the determining of the affected input may be achieved by first interpreting the library exchange file, which contains intra cell positioning information of circuitry within the cell, to determine inputs and outputs of the cell. Next, location of the inputs within the cell is determined. Then, one of the inputs is identified as the affected input based on the location of the one of the inputs being proximal to the error position.

The process then proceeds to step 28, where an available charge protection element is identified. For example, the available charge element may be identified by determining a closest charge protection element to the affected input or by determining a charge protection element along a wire coupled to the affected input.

The process then proceeds to step 30, where the available charge protection element is logically coupled to the affected input of the cell. Having made the logic connection, a routing algorithm is again performed to physically connect the available charge protection element to the affected input of the cell.

Figure 3:
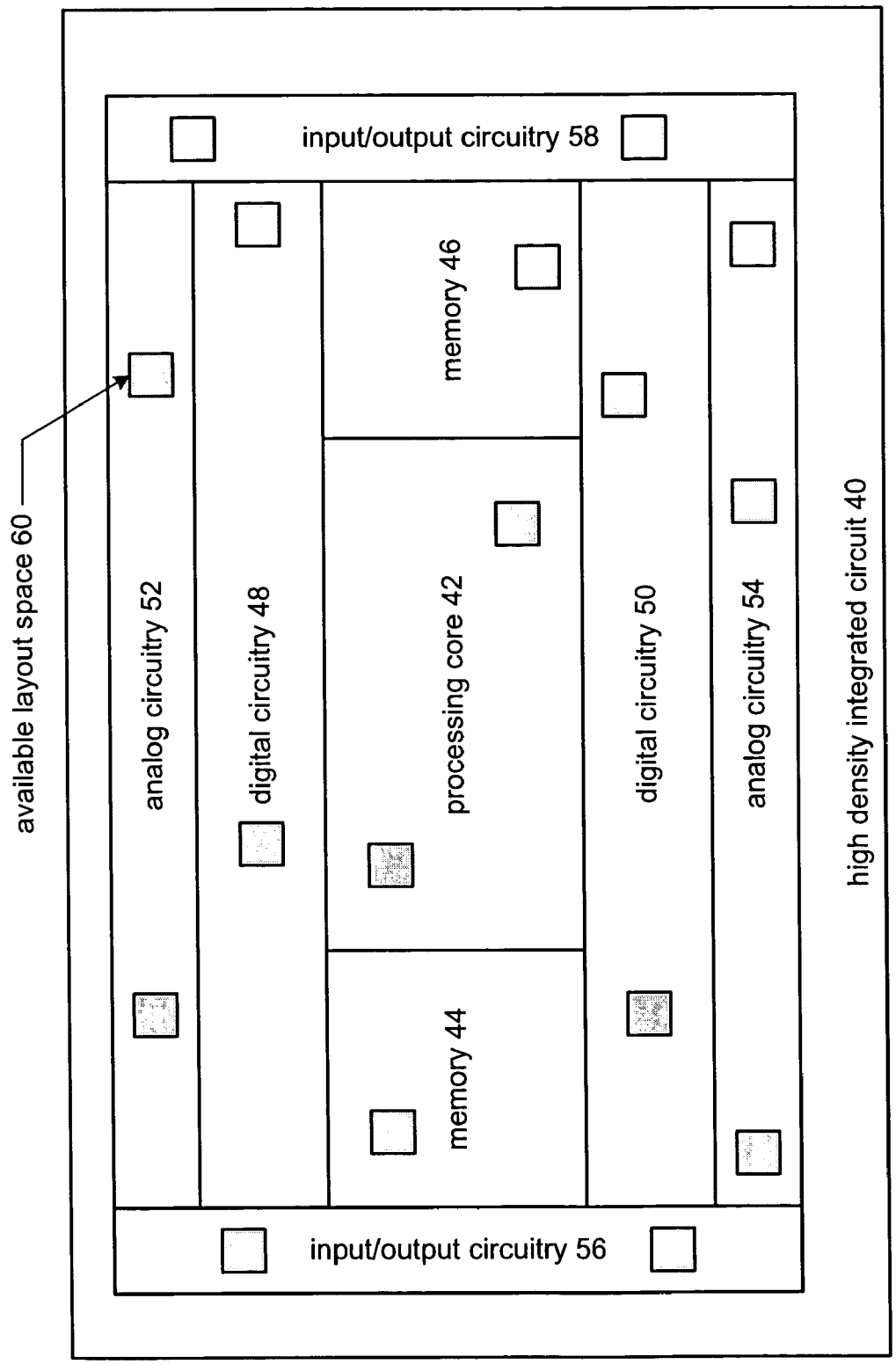
FIG. 3 is a block diagram of an initial IC layout in accordance with the present invention.

FIGS. 3–6 provide an illustrative example of the methods of FIGS. 1 and/or 2. FIG. 3 is a block diagram of an initial layout of a high-density integrated circuit (IC) 40. In this embodiment, the high-density IC 40 includes a processing core 42, memory 44 and 46, digital circuitry 48 and 50, analog circuitry 52 and 54, and input/output circuitry 56 and 58. The processing core 42 may include a digital signal processor, microprocessor, field programmable gate array (FPGA), state machine, and/or programmable logic. The memory 44 and 46 may be read only memory, random access memory, volatile memory, and/or non-volatile memory. The input/output circuitry 56 and 58 may include a serial interface, a parallel interface, a serial to parallel interface, and/or a parallel to serial interface. As one of average skill in the art will appreciate, an integrated circuit may include more or less circuitry than that illustrated in FIG. 3.

As is further shown, available layout space 60 is distributed throughout the IC layout. Accordingly, during the initial place and route processing, not every portion of the die will have a cell placed thereon. In high-density IC layouts, the available space is minimal and randomly distributed throughout the IC layout.

Figure 4:
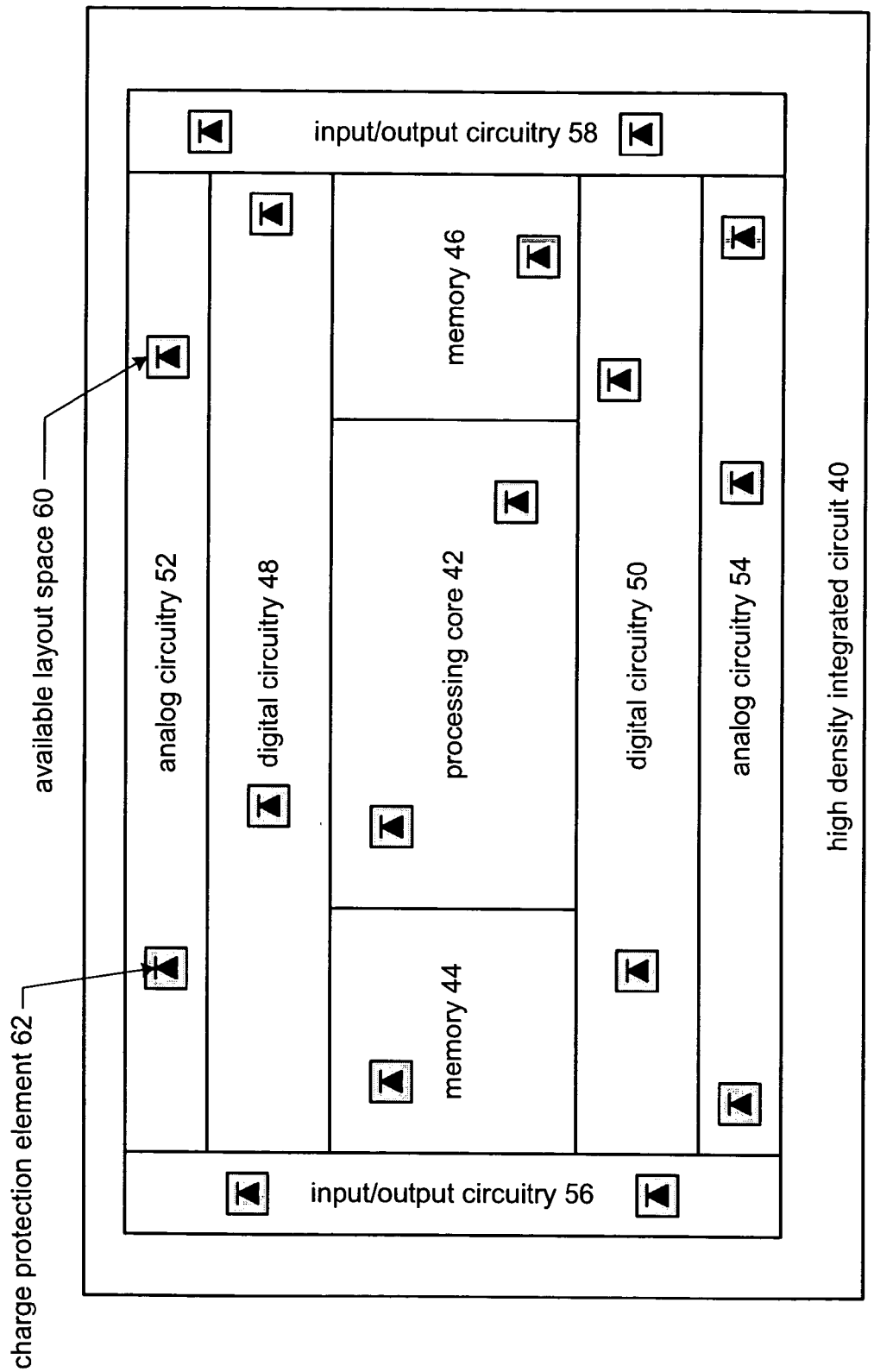
FIG. 4 is a block diagram of an intervening IC layout in accordance with the present invention.

FIG. 4 is a block diagram of the IC after charge protection elements 62 have been placed within the available space. The charge protection elements may be diodes, transistor, surge protectors, and/or any device that diverts energy when a voltage is exceeded.

Figure 5:
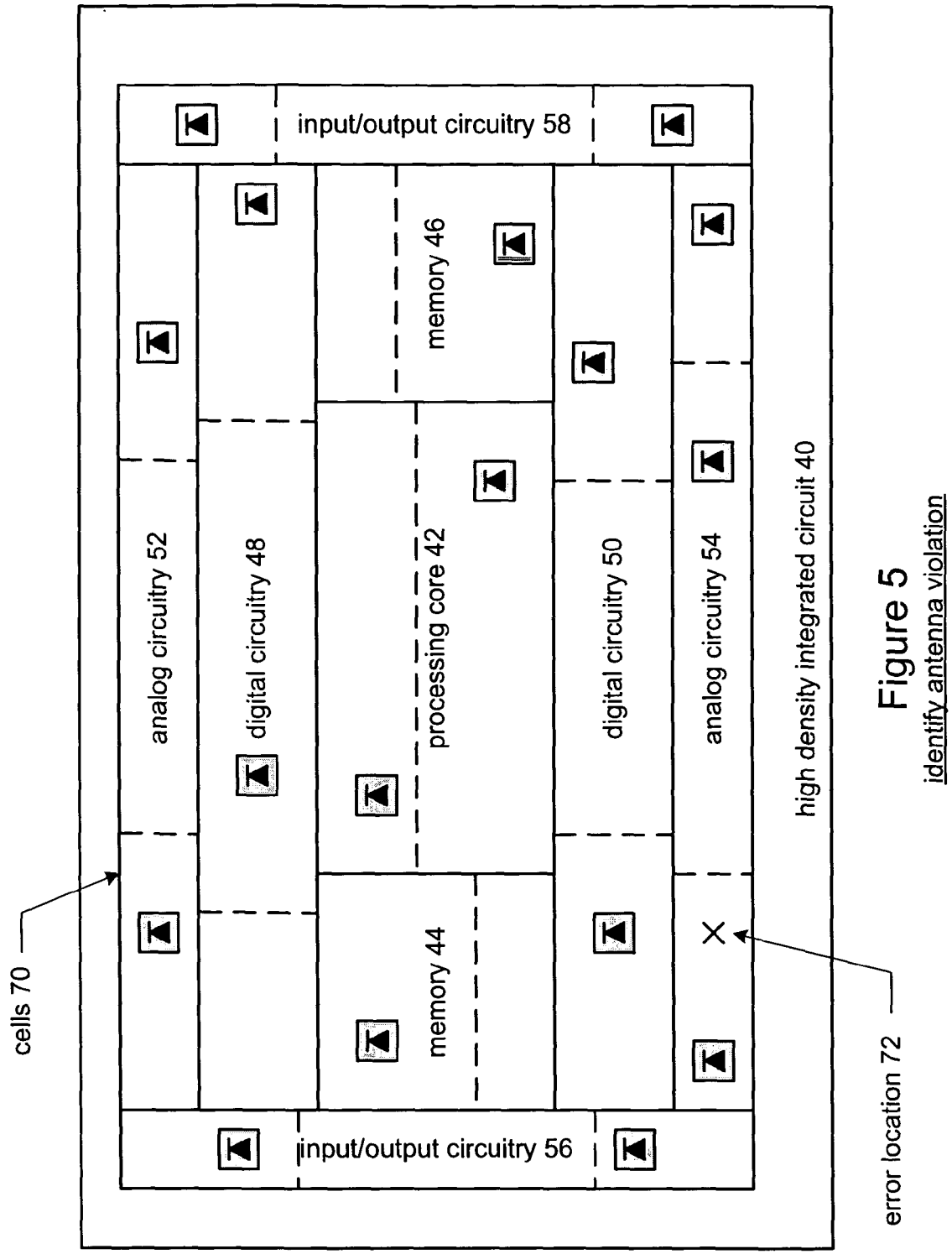
FIG. 5 is a block diagram of an IC layout having an antenna violation in accordance with the present invention.

FIG. 5 is a block diagram IC layout having an antenna violation as indicated by the error location 72. As is further shown, the circuitry of the IC includes a plurality of cells, which are contained in the design exchange format (DEF) file. For example, the analog circuitry 54 includes three cells as indicated by the dashed lines. The antenna violation occurs in the one of the cells.

Figure 6:
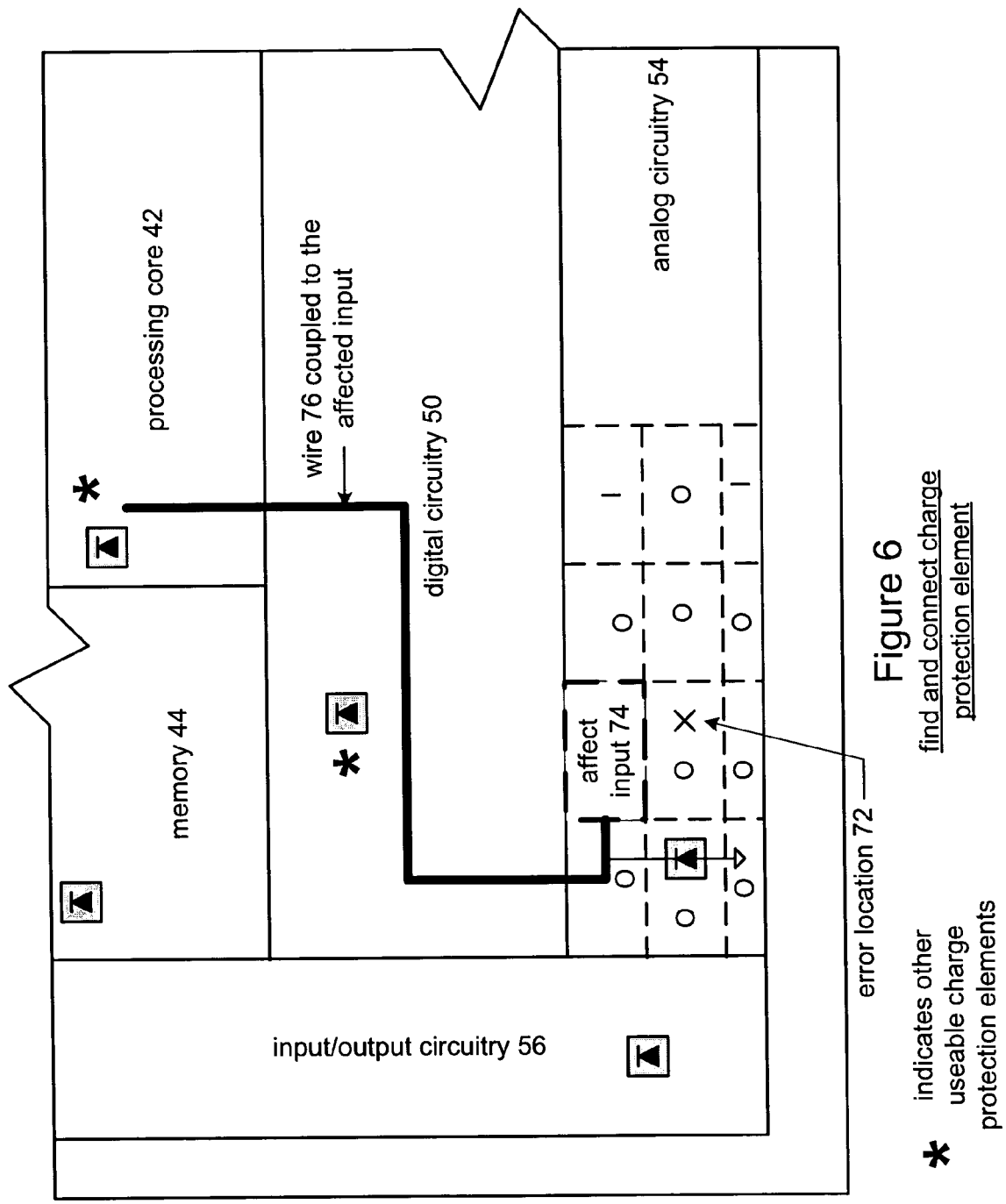
FIG. 6 is a block diagram of an IC layout having the antenna violation corrected in accordance with the present invention.

FIG. 6 is a narrower view of the error location and the affected cell. In this illustration, the affected cell includes a plurality of circuit elements that may be inputs and/or outputs. As further illustrated, the input circuit elements are indicated by the letter "I" and the output circuit elements are indicated by the letter "o". For example, an input circuit element may be a gate of transistor, where the gate oxide layer may be damaged by an accumulated charge on the wire, or trace, coupled to the gate of the transistor if the antenna violation is not corrected.

In this illustration, even though the error occurs in one portion of the cell, which is labeled as an output circuit element, the closest input circuit element is positioned above the error location and labeled as the affected input 74. As is further illustrated, a wire 76 runs across a portion of the IC, where the wire 76 couples the affected input to the processing core 42. In accordance with the present invention, any available charge protection element may be coupled to the affected input. As shown, the closest available charge protection element is coupled to the affected input 74 and to ground, although any available charge protection element proximal to the wire 76 may be used.

The preceding discussion has presented a method for correcting antenna violations within high-density integrated circuits. By placing charge protection elements in available IC layout space and subsequently coupling an available charge protection element to an input adversely affected by an antenna violation, the antenna violations can be readily overcome without substantial IC redesign. As one of average skill in the art will appreciate, other embodiments may be derived from the teachings of the present invention without deviating from the scope of the claims.

What is claimed is:

1. A method for correcting antenna violations in high-density integrated circuits, the method comprises:
   interpreting an integrated circuit error report to obtain error coordinates;
   determining a cell of the integrated circuit based on the error coordinates and a design exchange format file;
   determining error position within the cell based on the error coordinates;
   determining an affected input of the cell based on the error position and a library exchange file;
   identifying an available charge protection element; and
   logically coupling the available charge protection element to the affected input of the cell.

2. The method of claim 1 further comprises:
   generating an updated design exchange format file; and
   executing a design rule checking algorithm to obtain the integrated circuit error report.

3. The method of claim 1 further comprises:
   generating an updated design exchange format file; and
   executing a routing algorithm to physically connect the available charge protection element to the affected input of the cell.

4. The method of claim 1 wherein the identifying the available charge element further comprises at least one of:
   determining closest element to the affected input; and
   determining element along a wire coupled to the affected input.

5. The method of claim 1 wherein the determining the affected input of the cell based on the error position and the library exchange file further comprises:
   interpreting the library exchange file to determine inputs and outputs of the cell; determining location of the inputs within the cell; and
   identifying one of the inputs as the affected input based on the location of the one of the inputs being proximal to the error position.

6. The method of claim 1 further comprises, prior to interpreting an integrated circuit error report:
   performing a place and route algorithm to position cells to form an initial layout of the integrated circuit;
   determining available space within the initial layout;
   placing at least one charge protection element within the available space; and
   re-performing the place and route algorithm to produce a layout of the integrated circuit to include the coupling of the available charge protection element to the affected input of the cell.

7. The method of claim 1 wherein the charge protection element comprises at least one of: a diode, a transistor, and a surge protector.

8. An integrated circuit comprises:
   a plurality of cells arranged to form an integrated circuit layout; and
   a plurality of charge protection elements placed within available space of the integrated circuit layout, wherein at least one of the plurality of charge protection elements is coupled to at least one of the plurality of cells by:
      interpreting an integrated circuit error report to obtain error coordinates;
      determining a cell of the plurality of cells based on the error coordinates and a design exchange format file;
      determining error position within the cell based on the error coordinates;
   determining an affected input of the cell based on the error position and a library exchange file;
      identifying an available charge protection element of the plurality of charge protection elements; and
      coupling the available charge protection element to the affected input of the cell.

9. The integrated circuit of claim 8, wherein the coupling the available charge protection element to the affected input of the cell further comprises: executing a design rule checking algorithm to obtain the integrated circuit error report.

10. The integrated circuit of claim 8, wherein the coupling the available charge protection element to the affected input of the cell further comprises:
   generating an updated design exchange format file; and
   executing a routing algorithm to physically connect the available charge protection element to the affected input of the cell.

11. The integrated circuit of claim 8, wherein the identifying the available charge element further comprises at least one of:
- determining a closest one of the plurality of charge protection elements to the affected input; and
- determining a charge protection element of the plurality of charge protection elements along a wire coupled to the affected input.

12. The integrated circuit of claim 8, wherein the determining the affected input of the cell based on the error position and the library exchange file further comprises:
- interpreting the library exchange file to determine inputs and outputs of the cell;
- determining location of the inputs within the cell; and
- identifying one of the inputs as the affected input based on the location of the one of the inputs being proximal to the error position.

13. The integrated circuit of claim 8 wherein the coupling the available charge protection element to the affected input of the cell further comprises, prior to interpreting an integrated circuit error report:
- performing a place and route algorithm to position the plurality of cells to form an initial layout of the integrated circuit;
- determining the available space within the initial layout;
- placing the plurality of charge protection elements within the available space; and
- re-performing the place and route algorithm to produce the integrated circuit layout to include the coupling of the available charge protection element to the affected input of the cell.

14. The integrated circuit of claim 8 wherein each of the plurality of charge protection elements comprises at least one of: a diode, a transistor, and a surge protector.

* * * * *